United States Patent
Ni et al.

(10) Patent No.: US 12,117,351 B2
(45) Date of Patent: Oct. 15, 2024

(54) COMPUTING SYSTEMS WITH POWER PROTECTION USING INFRARED SENSORS

(71) Applicant: QUANTA COMPUTER INC., Taoyuan (TW)

(72) Inventors: Hsiao-Tsu Ni, Taoyuan (TW); Ying-Che Chang, Taoyuan (TW); Chao-Nan Lin, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 686 days.

(21) Appl. No.: 17/326,544

(22) Filed: May 21, 2021

(65) Prior Publication Data

US 2022/0373407 A1 Nov. 24, 2022

(51) Int. Cl.
*G01K 11/00* (2006.01)
*H05K 1/18* (2006.01)
*H05K 7/04* (2006.01)

(52) U.S. Cl.
CPC ........... *G01K 11/006* (2013.01); *H05K 1/181* (2013.01); *H05K 7/04* (2013.01); *H05K 2201/10151* (2013.01); *H05K 2201/10181* (2013.01); *H05K 2201/10363* (2013.01)

(58) Field of Classification Search
None
See application file for complete search history.

(56) References Cited

U.S. PATENT DOCUMENTS

| | | | |
|---|---|---|---|
| 2009/0324179 A1* | 12/2009 | Xia | G02B 6/3502 385/99 |
| 2019/0025134 A1* | 1/2019 | Ju | H01M 10/425 |
| 2020/0075063 A1 | 3/2020 | Lovett | |
| 2020/0153233 A1* | 5/2020 | Michna | H02H 5/043 |
| 2020/0209935 A1* | 7/2020 | Har-Shai | G08B 21/18 |

FOREIGN PATENT DOCUMENTS

| | | |
|---|---|---|
| TW | 200625065 A | 7/2006 |
| TW | 201902324 A | 1/2019 |
| TW | 201908917 A | 3/2019 |

* cited by examiner

*Primary Examiner* — Erica S Lin
(74) *Attorney, Agent, or Firm* — NIXON PEABODY LLP

(57) ABSTRACT

A system includes a first printed circuit board (PCB), a temperature sensor, a switching circuit provided on the first PCB, and a controller. The temperature sensor is configured to measure temperature of at least an area of the first PCB. The controller is configured to trigger the switching circuit to turn off power to the first PCB, based at least in part on the temperature sensor detecting a temperature above a temperature threshold. The system is able to disrupt power much faster than conventional methods of power protection which may have a blind spot to certain areas of the first PCB, since these methods rely on power disruption when a maximum power is sensed.

20 Claims, 3 Drawing Sheets

COMPUTING SYSTEMS WITH POWER PROTECTION USING INFRARED SENSORS

FIELD OF THE INVENTION

The present invention relates generally to a computing device, and more specifically, to responding to a detected high-temperature region on a printed circuit board of the computing device.

BACKGROUND OF THE INVENTION

Computing systems typically include printed circuit boards (PCBs) that generate heat. The PCBs can include electronic fuses (eFuses) for changing operation of the PCBs for power protection purposes. eFuses and/or hot swap controllers are designed to protect computing systems when dynamic plug in/out and/or short circuits can cause PCBs to burn. Short circuit protection offered by eFuses and/or hot swap controllers utilizes maximum current of a power domain or a net or metal trace on PCBs. These short circuit protections are intended to protect as a trigger threshold by monitoring current passing through eFuses and/or hot swap controller sub-systems. Once current exceeds a certain threshold setting, the eFuses and/or hot swap controllers disrupt the current flow.

There are several disadvantages to current eFuses and/or hot swap controller sub-systems. These systems do not take into account protection when maximum current and/or power is not reached on the power domain and/or the net or metal trace. As such, power plane topology on the PCB can leave some areas of the PCB unprotected by eFuses and/or hot swap controller sub-systems. The present disclosure is directed at solving some of these problems associated with eFuses and/or hot swap controllers and other problems.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a system includes a first PCB, a temperature sensor configured to measure temperature of at least an area of the first PCB, a switching circuit provided on the first PCB, and a controller. The controller is configured to trigger the switching circuit to turn off power to the first PCB based at least in part on the temperature sensor detecting a temperature above a temperature threshold.

In an implementation, the temperature sensor is an infrared sensor. In an implementation, the temperature sensor is an array of infrared sensors. In an implementation, a second PCB connected to the first PCB via a communication bus. The second PCB includes the temperature sensor. In an implementation, the system further includes a chassis with a top portion and a bottom portion. The first PCB is attached to the bottom portion of the chassis, and the second PCB is attached to the top portion of the chassis. The communication bus can be a hanging jumper cable from the first PCB to the second PCB. In an implementation, the switching circuit is a hot swap controller, an electronic fuse, or any power controller device that can enable/disable power.

According to certain aspects of the present disclosure, a method implemented by a controller in a computing system is provided. The method includes receiving, from a temperature sensor, temperature pertaining to at least an area of a first printed circuit board (PCB) secured to a bottom surface of a chassis of the computing system. The method further includes determining whether the received temperature exceeds a temperature threshold. The method further includes triggering a switching circuit to turn off power to the first PCB based at least in part on the received temperature exceeding the temperature threshold.

In an implementation, the temperature sensor is an infrared sensor. In an implementation, the temperature sensor is an array of infrared sensors. In an implementation, the temperature is received via a communication bus that connects a second PCB to the first PCB, and the temperature sensor is provided on the second PCB. The second PCB can be provided on a top surface of the chassis of the computing system. The communication bus can be a hanging jumper cable from the first PCB to the second PCB. In an implementation, the switching circuit is a hot swap controller, an electronic fuse, or any power controller device that can enable/disable power.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1:
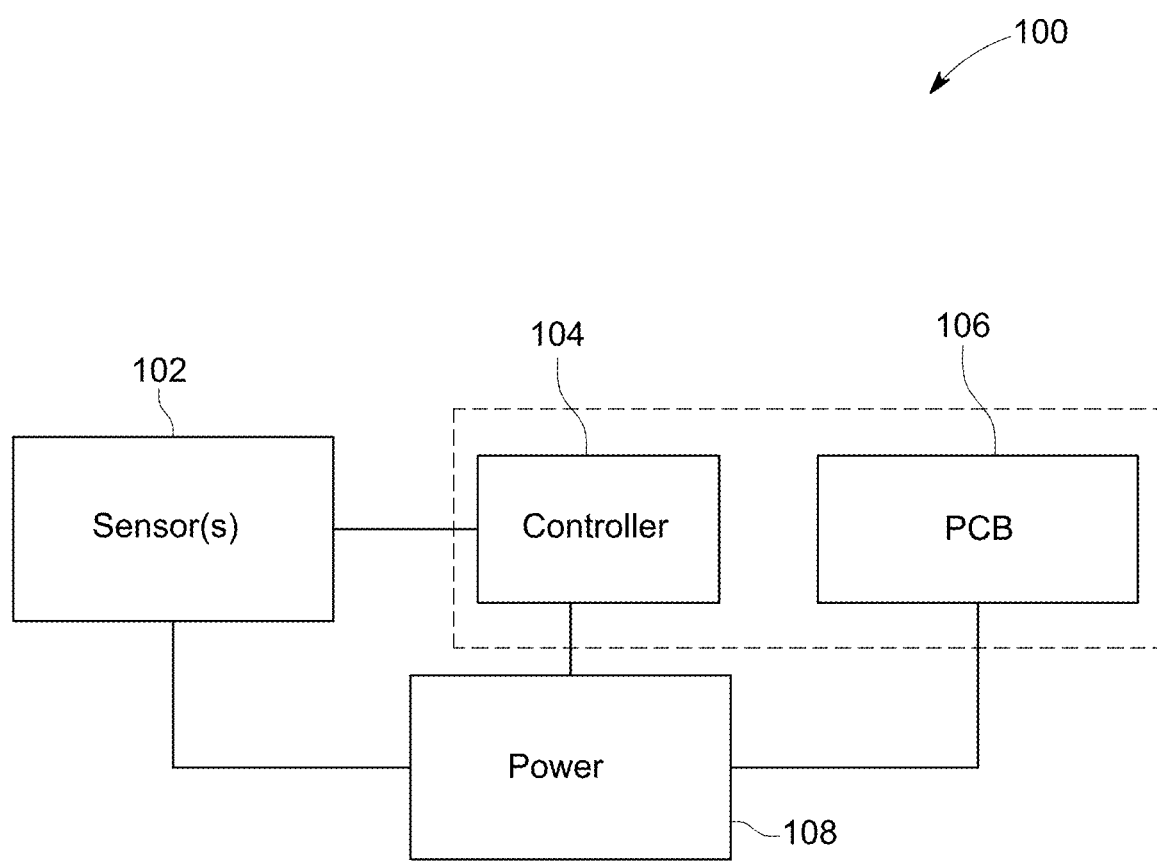
FIG. 1 is a system for providing power protection to components on a printed circuit board (PCB), according to certain aspects of the present disclosure.

Circuit components placed on printed circuit boards (PCBs) can generate heat sporadically or at very concentrated areas on the PCBs. Depending on the inability to dissipate excessive heat, circuit components or metal traces on the PCBs can become damaged. Embodiments of the present disclosure provide systems and methods for detecting excessive heat generation on PCBs and disrupting power to prevent damage of circuit components on the PCB.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Referring to FIG. 1, a system 100 for disrupting power to a PCB 106 using one or more sensors 102 is provided, according to some implementations of the present disclosure. The system 100 includes the sensors 102, a power supply 108, a controller 104, and the PCB 106. The PCB 106 and the controller 104 are shown as different components. However, in some implementations, the controller 104 can be integrated on the PCB 106. The PCB 106 can include resistors, integrated circuits, processors, transistors, etc. The sensors 102 can include an infrared sensor or an infrared camera. The sensors 102 detect heat generated on the PCB 106. The controller 104 determines whether the generated heat on the PCB 106 is greater than a temperature threshold. The controller 104 disrupts power to the PCB 106 based at least in part on the generated heat on the PCB 106 being greater than the temperature threshold. In some implementations, the temperature threshold is 70° C. In some implementations, the temperature threshold is set lower than a temperature rating for at least one component installed on the PCB 106. For example, a lowest rated component on the PCB 106 is 85° C., hence to prevent damage to the component or to prevent exposing the component to temperatures to which the component is not rated for, the temperature threshold is set at 80° C.

The power supply 108 provides power to the sensors 102, the controller 104, and the PCB 106. The power supply 108 can be one power supply or can include a combination of multiple power supplies. For example, the sensors 102 can operate on a different power (e.g., a battery) than the PCB 106 (e.g., an AC power source).

Figure 2:
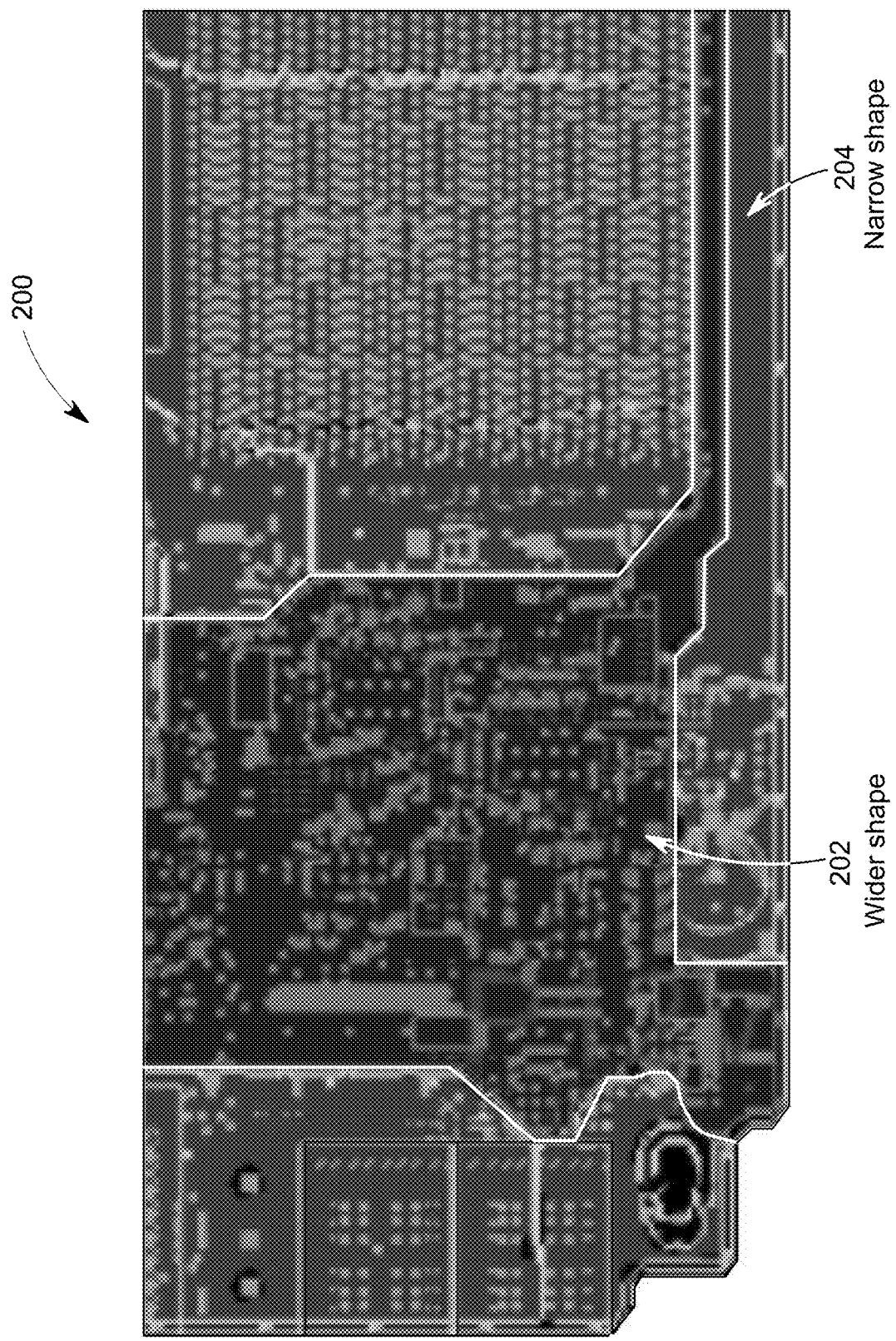
FIG. 2 is a partial top view of a PCB showing heat distribution, according to certain aspects of the present disclosure.

Referring to FIG. 2, a PCB 200 is provided, according to some implementations of the present disclosure. The PCB 200 includes two shape regions—a wide shape region 202 and a narrow shape region 204. The shape regions are examples of heat distribution across the surface of the PCB 200, indicating that heat may not be uniformly distributed across the PCB 200. There are some areas on the PCB 200 that a conventional eFuse and/or hot swap controller cannot adequately protect. For example, uneven power distribution on the PCB 200 can result in the wide shape region 202 and the narrow shape region 204. Conventional eFuse and/or hot swap controllers may fail to protect a circuit or component that shorts and/or becomes damaged, causing abnormally high current. If the abnormally high current is below a current threshold or is away from an area where the eFuse and/or hot swap controller is operating, then the power protection will fail to protect circuit components and can cause the PCB 200 to burn in the narrow shape region 204.

Figure 3:
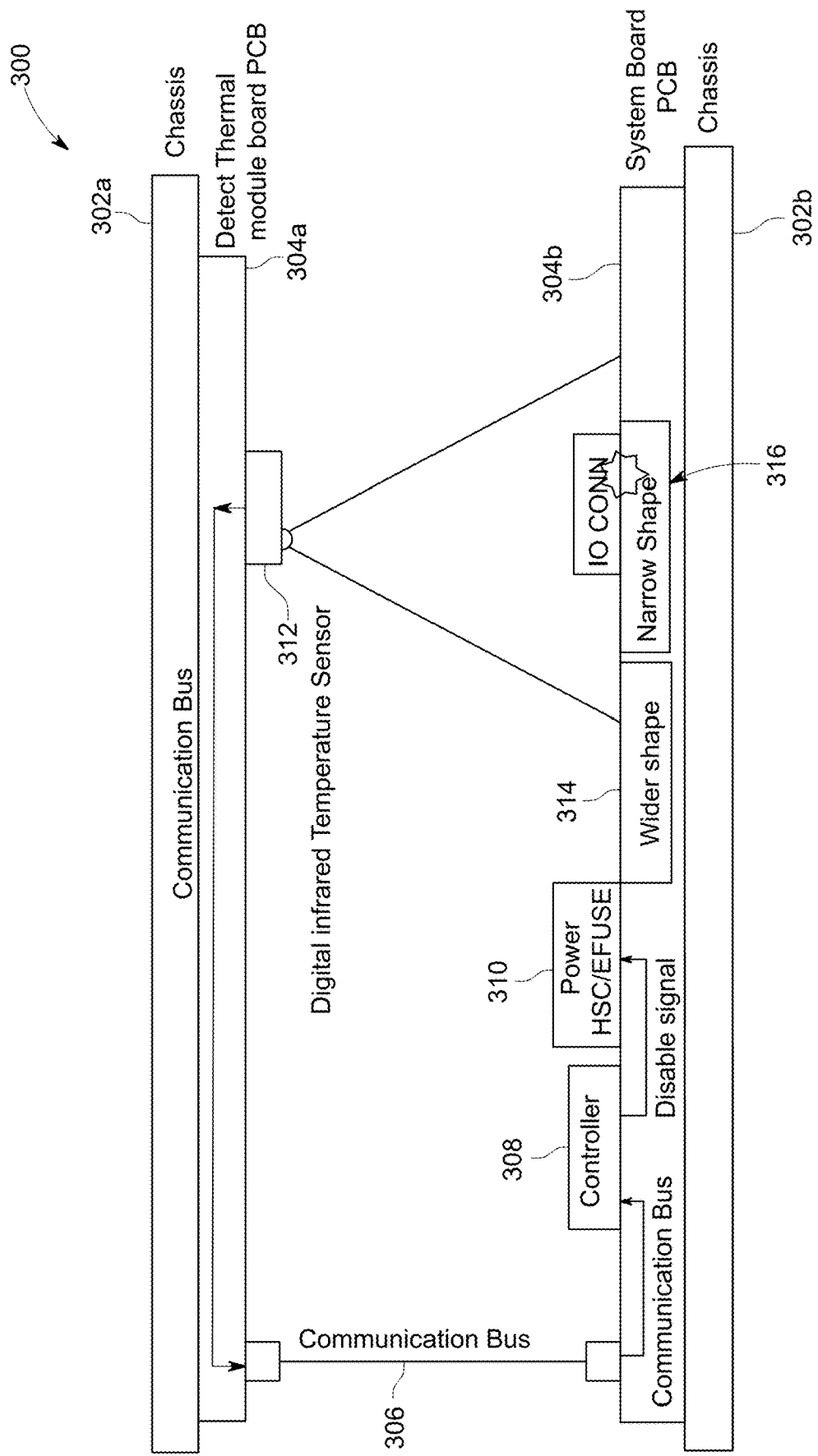
FIG. 3 is an example system for providing power protection to components on a PCB, according to certain aspects of the present disclosure.

Referring to FIG. 3, a cross section view of a system 300 for providing power protection to components on a PCB 304b is provided, according to certain aspects of the present disclosure. The system 300 can be a computing system (e.g., a server, a desktop computer, a laptop computer, etc.), a measurement equipment, a consumer electronic, etc. The system 300 includes a chassis having a top chassis portion 302a and a bottom chassis portion 302b. The PCB 304b is provided on the bottom chassis portion 302b, and a thermal detection PCB 304a is provided on the top chassis portion 302a.

The thermal detection PCB 304a includes an infrared sensor 312. The infrared sensor 312 can be an array or matrix of infrared sensors dispersed across a surface of the PCB 304a. The infrared sensor 312 can measure temperature of the PCB 304b. Measured temperature information is communicated by the infrared sensor 312 through a communication bus 306 that connects the PCB 304a and the PCB 304b. The communication bus 306 can be a hanging jumper cable that connects the PCB 304a and the PCB 304b. The separation of the PCB 304a and the PCB 304b can dictate the field of view of the infrared sensor 312. In some implementations, distance between the top chassis portion 302a and the bottom chassis portion 302b is adjustable so that the field of view of the infrared sensor 312 viewing the PCB 304b is adjusted. The closer the infrared sensor 312 is to the PCB 304b, the smaller the field of view of the infrared sensor 312. Thus, the infrared sensor 312 will cover a smaller area on the PCB 304b. Alternatively, the farther the infrared sensor 312 is to the PCB 304b, the larger the field of view of the infrared sensor 312. Thus, the infrared sensor 312 will cover a larger area on the PCB 304b.

In some implementations, the infrared sensor 312 is a digital infrared temperature sensor (e.g., ORISYSTECH OTI-502 T120). The infrared sensor 312 can include multiple temperature sensors in a surface-mount device package. For example, the surface-mount device package can include an ambient temperature detection sensor, an object temperature detection sensor, and an application-specific circuit. In some implementations, the infrared sensor 312 can determine ambient temperature in a range between −20° C. and 85° C. In some implementations, the infrared sensor 312 can determine object temperature in a range between −20° C. and 120° C. In some implementations, the infrared sensor 312 can determine object temperature resolution within 0.01° C. The infrared sensor 312 can communicate measured temperature information using I²C data line. In some implementations, the infrared sensor 312 requires an I²C clock line from at least one of the PCB 304a or the PCB 304b to run any digital application-specific circuits within the infrared sensor 312.

The PCB 304b includes a controller 308, a switching circuit 310 (e.g., a hot swap controller, an eFuse, or any power controller device that can enable and/or disable power). The PCB 304b may have areas that exhibit wide shape regions 314 (similar to the wide shape region 202 of FIG. 2) and/or narrow shape regions 316 (similar to the narrow shape region 204 of FIG. 2). Whether specific areas on the PCB 304b are categorized as wide shape regions 314 or narrow shape regions 316 depends on circuit components on the PCB 304b as well as power distribution between the circuit components on the PCB 304b. Depending on the field of view of the infrared sensor 312, the controller 308 in cooperation with the infrared sensor 312 can determine that a temperature sensed on the PCB 304b in the narrow shape regions 316 exceeds a temperature threshold. The controller 308 can provide a disable signal to the switching circuit 310 to turn off power to the PCB 304b. By using the sensed temperature to control power supply to the PCB 304b, PCB burning or damage caused by over-current conditions can be avoided.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A system comprising:
a chassis having a top portion and a bottom portion, the top portion arranged parallel to the bottom;
a first printed circuit board (PCB) attached to the bottom portion of the chassis;
a second PCB attached to the top portion of the chassis, the second PCB communicatively coupled to the first PCB, the second PCB including a temperature sensor configured to measure temperature of at least an area of the first PCB;
a switching circuit provided on the first PCB; and
a controller provided on the first PCB, the controller being communicatively coupled to the temperature sensor and configured to receive temperature information from the temperature sensor and trigger the switching circuit to turn off power to the first PCB based at least in part on the temperature information indicating a temperature above a temperature threshold.

2. The system of claim 1, wherein the temperature sensor is an infrared sensor.

3. The system of claim 1, wherein the temperature sensor is an array of infrared sensors.

4. The system of claim 1, wherein:
the second PCB is connected to the first PCB via a communication bus.

5. The system of claim 4, wherein the communication bus is a hanging jumper cable from the first PCB to the second PCB.

6. The system of claim 1, wherein the switching circuit is a hot swap controller, an electronic fuse, or any power controller device that can enable/disable power.

7. A method implemented by a controller in a computing system, comprising:
receiving, from a temperature sensor, temperature information pertaining to at least an area of a first printed circuit board (PCB), the first PCB secured to a bottom portion of a chassis of the computing system and the temperature sensor provided on a second PCB secured to a top portion of the chassis, the top portion arranged in parallel to the bottom portion;
determining, via a controller provided on the first PCB, whether the received temperature information indicates that a temperature exceeds a temperature threshold, the controller being communicatively coupled to the temperature sensor; and
triggering a switching circuit to turn off power to the first PCB based at least in part on the received temperature exceeding the temperature threshold, the switching circuit provided on the first PCB.

8. The method of claim 7, wherein the temperature sensor is an infrared sensor.

9. The method of claim 7, wherein the temperature sensor is an array of infrared sensors.

10. The method of claim 7, wherein the temperature is received via a communication bus that connects a second PCB to the first PCB.

11. The method of claim 10, wherein the communication bus is a hanging jumper cable from the first PCB to the second PCB.

12. The method of claim 7, wherein the switching circuit is a hot swap controller, an electronic fuse, or any power controller device that can enable/disable power.

13. The system of claim 2, wherein a field of view of the infrared sensor is determined by a separation between the first PCB and the second PCB.

14. The system of claim 13, wherein a distance between the top portion of the chassis and the bottom portion of the chassis is adjustable such that the separation between the first PCB and the second PCB is changeable to adjust the field of view of the infrared sensor.

15. The system of claim 2, wherein the infrared sensor comprises digital circuits, the digital circuits configured to receive an I²C clock from the first PCB.

16. The system of claim 3, wherein the array of infrared sensors is dispersed across a surface of the second PCB.

17. The method of claim 8, wherein a field of view of the infrared sensor is determined by a separation between the first PCB and the second PCB.

18. The method of claim 17, further comprising:

adjusting a distance between the top portion of the chassis and the bottom portion of the chassis to either increase or decrease the separation between the first PCB and the second PCB to adjust a field of view of the infrared sensor.

19. The method of claim 8, further comprising:
receiving, by the infrared sensor, an I²C clock from the first PCB to run digital circuits within the infrared sensor.

20. The method of claim 9, wherein the array of infrared sensors is dispersed across a surface of the second PCB.

\* \* \* \* \*